(12) United States Patent
Matsumoto et al.

(10) Patent No.: US 10,868,501 B2
(45) Date of Patent: Dec. 15, 2020

(54) WIRELESS RECEIVER AND WIRELESS RECEPTION METHOD

(71) Applicant: DENSO CORPORATION, Kariya (JP)

(72) Inventors: Takashi Matsumoto, Tokyo (JP); Yusuke Wachi, Tokyo (JP); Koji Maeda, Tokyo (JP)

(73) Assignee: DENSO CORPORATION, Kariya (JP)

( * ) Notice: Subject to any disclaimer, the term of this patent is extended or adjusted under 35 U.S.C. 154(b) by 38 days.

(21) Appl. No.: 16/263,138

(22) Filed: Jan. 31, 2019

(65) Prior Publication Data

US 2019/0165741 A1    May 30, 2019

Related U.S. Application Data

(63) Continuation of application No. PCT/JP2016/086733, filed on Dec. 9, 2016.

(51) Int. Cl.
| | | |
|---|---|---|
| *H03F 1/30* | (2006.01) | |
| *H03F 3/193* | (2006.01) | |
| *H03F 3/343* | (2006.01) | |
| *H04B 1/18* | (2006.01) | |
| *H03D 7/14* | (2006.01) | |
| *G05D 23/24* | (2006.01) | |
| *H03G 3/30* | (2006.01) | |
| *H03D 7/16* | (2006.01) | |
| *H04B 1/30* | (2006.01) | |
| *H03F 3/45* | (2006.01) | |
| *H03F 3/191* | (2006.01) | |

(52) U.S. Cl.
CPC ............ *H03F 1/302* (2013.01); *G05D 23/24* (2013.01); *H03D 7/14* (2013.01); *H03D 7/1433* (2013.01); *H03D 7/1458* (2013.01); *H03D 7/165* (2013.01); *H03F 3/191* (2013.01); *H03F 3/193* (2013.01); *H03F 3/343* (2013.01); *H03F 3/45085* (2013.01); *H03G 3/3052* (2013.01); *H04B 1/18* (2013.01); *H04B 1/30* (2013.01); *H03D 2200/0023* (2013.01); *H03D 2200/0082* (2013.01); *H03D 2200/0098* (2013.01); *H03F 2200/294* (2013.01); *H03F 2200/447* (2013.01); *H03F 2203/45481* (2013.01); *H03F 2203/45662* (2013.01); *H03F 2203/45731* (2013.01)

(58) Field of Classification Search
USPC ................................. 330/289, 256, 266, 272
See application file for complete search history.

(56) References Cited

U.S. PATENT DOCUMENTS

2019/0204253 A1* 7/2019 Yoo .......................... G01K 7/24

FOREIGN PATENT DOCUMENTS

| JP | 2008-124406 A | 5/2008 |
|---|---|---|
| JP | 2010-239191 A | 10/2010 |

* cited by examiner

*Primary Examiner* — Hieu P Nguyen
(74) *Attorney, Agent, or Firm* — Posz Law Group, PLC

(57) ABSTRACT

A wireless receiver and a wireless reception method provide: to determine a gain based on a first resistor having a first temperature characteristic and a second resistor having a second temperature characteristic different from the first resistance; to output an output of the first resistor and an output of the second resistor, or a ratio between the output of the first resistor and the output of the second resistor; and to switches the gain of the first circuit based on the outputs or the ratio between the outputs.

10 Claims, 3 Drawing Sheets

WIRELESS RECEIVER AND WIRELESS RECEPTION METHOD

CROSS REFERENCE TO RELATED APPLICATION

The present application is a continuation application of International Patent Application No. PCT/JP2016/086733 filed on Dec. 9, 2016, which designated the U.S. The entire disclosures of all of the above applications are incorporated herein by reference.

TECHNICAL FIELD

The present disclosure relates to a wireless receiver and a wireless reception method for, for example, vehicular applications.

BACKGROUND

With interest in driving safety such as an anti-collision system and progress of technological innovation, a vehicle is equipped with many sensors. Specifically, a millimeter wave radar for detecting without depending on natural conditions such as bad weather and darkness is a promising way. When the system installed in luxury cars spread to popular cars, the system is required to function under severe environmental conditions represented by conventional temperature conditions (for example, −40° C. to 125° C.) with an inexpensive cost and highly reliability.

SUMMARY

A wireless receiver and a wireless reception method provide: to determine a gain based on a first resistor having a first temperature characteristic and a second resistor having a second temperature characteristic different from the first resistance; to output an output of the first resistor and an output of the second resistor, or a ratio between the output of the first resistor and the output of the second resistor; and to switches the gain of the first circuit based on the outputs or the ratio between the outputs.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
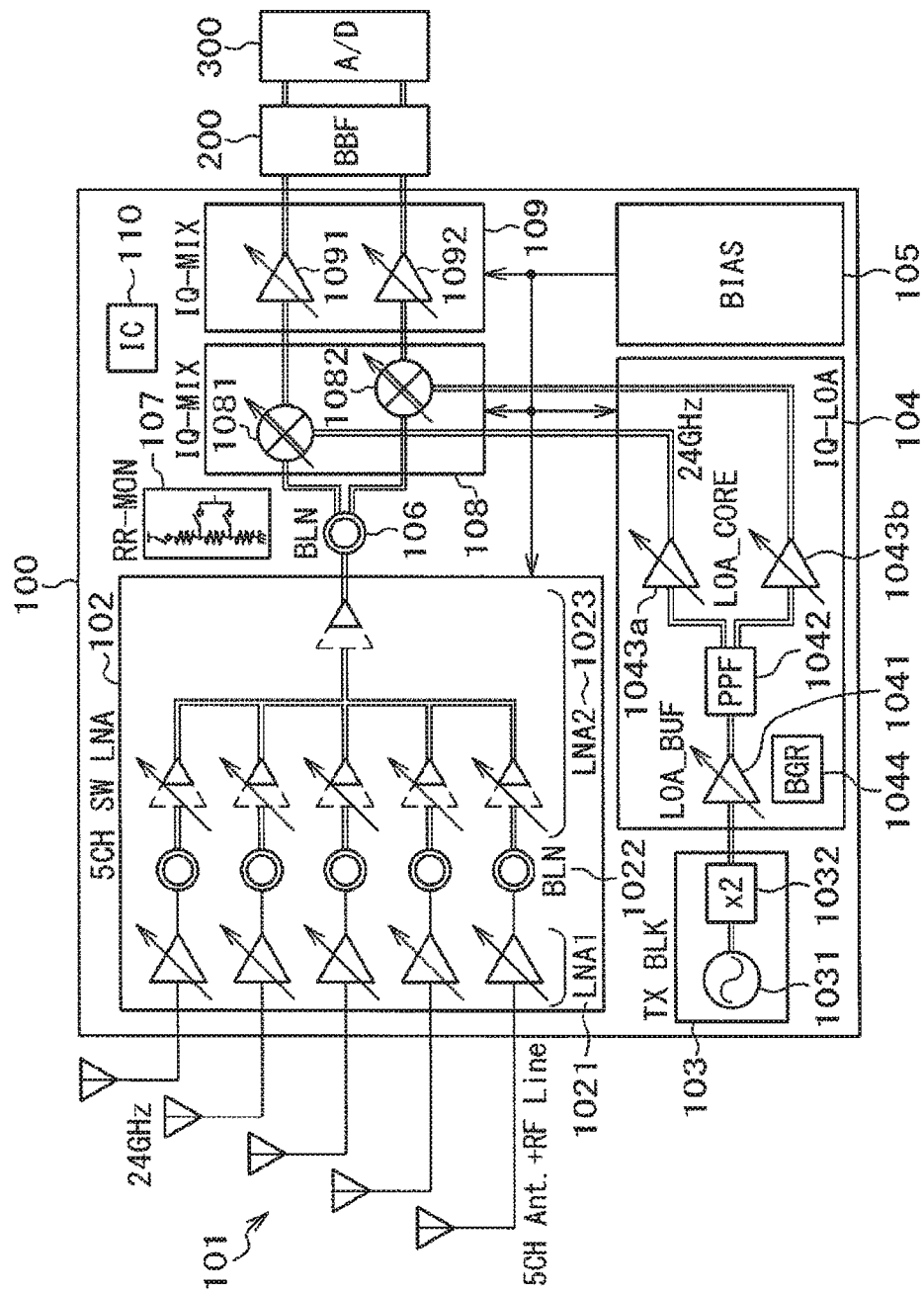
FIG. 1 is a diagram illustrating a configuration example of a reception unit included in a wireless receiver.

A vehicular system is required to function under severe environmental conditions represented by conventional temperature conditions (for example, −40° C. to 125° C.) with an inexpensive cost and highly reliability. In order to realize this operation, in particular, the RF circuit and/or the analog circuit need to operate in a wide range of temperature and it is necessary to correct the receiving characteristic which changes with temperature. However, when the reception characteristics include discontinuous features, there is a possibility of erroneous detection or detection failure, and therefore, it is difficult to correct the reception characteristics in real time. In view of this, the receiving circuit of the wireless receiver needs to realize the temperature compensation using a circuit system that self-corrects itself in an analog manner so that the fluctuation of the gain in a wide temperature range is restricted within a certain range.

For example, the controller outputs a temperature signal and a sensor signal for correcting characteristics of a plurality of elements as monitor data, and corrects characteristics of elements of the analog circuit according to monitor data. In addition, for example, in a semiconductor integrated circuit in which the influence on the amplification characteristic due to the load fluctuation of the amplifier and the temperature change attributed to the variation of the resistance element is reduced, the monitor resistance element is measured, the adjustment resistance element is selected according to the resistance value of the monitor resistance element, and the bias voltage of the amplifier circuit is adjusted.

In the above features, a sensor for detecting temperature and manufacturing variations is built in. The detection result is outputted as an external digital signal, and a setting signal for correction is received from the outside, so that variations are reduced. However, in the case of quantization, for example, the gain characteristic varies stepwise, but it does not correspond to such a change. Also, there is no consideration for variations in the sensors themselves made by the same wafer manufacturing process. Further, in the above features, manufacturing variations are monitored from the reference current of the band gap reference circuit and the monitor resistance element, and a manufacturing process variation is corrected by selecting a resistance circuit close to requirement. However, when the temperature changes, the temperature change cannot be corrected, and it is difficult to cover a wide temperature range such as −40° C. to 125° C., for example.

Present example embodiments provide a wireless receiver and a wireless reception method which make the gain substantially constant over a wide temperature range even when a sensor having manufacturing variations is used.

A wireless receiver according to the present example embodiments includes: a first circuit for determining a gain according to a first resistor having a first temperature characteristic and a second resistor having a temperature characteristic different from the first resistor; a second circuit for outputting a ratio between an output value of the first resistor and an output value of the second resistor or the output value of the first resistor and the output value of the second resistor; and a third circuit for switching the gain of the first circuit based on the ratio of the output values or the output values outputted from the second circuit.

Further, the present example embodiments may be applied to a wireless reception method using the above wireless receiver.

According to the present example embodiments, it is possible to make the gain substantially constant even in a wide temperature range.

Embodiments of a wireless receiver and a wireless reception method will be described in detail below with reference to the accompanying drawings. Hereinbelow, as an example, a wireless transceiver for radar is described. Alternatively, for example, it may be applied to a device having various electronic circuits that are used in places with large environmental fluctuation such as outdoor and are required to maintain the temperature dependency to be constant. Since the low noise amplifier (i.e., LNA) that determines the noise and the distortion characteristics greatly affects the reception performance, the gain is not determined by controlling the current in the LNA, but the gain is switched by the mixer as a later stage circuit. Alternatively, the gain may be switched by an intermediate frequency amplifier circuit (i.e., IFA).

FIG. 1 is a diagram illustrating a configuration example of a reception unit 100 included in a wireless receiver. As shown in FIG. 1, the reception unit 100 includes an antenna 101, an LNA (i.e., Low Noise Amplifier) 102, a local oscillator 103, an LOA (i.e., Local Oscillator Amplifier) 104, a BIAS 105, a balun 106, a monitor circuit 107, a mixer 108, an IFA 109, and an IC chip 110. It is to be noted that the BBF 200 is a baseband filter, which is a filter circuit that excites the frequency characteristics of the differential signal at the predetermined frequency output from the reception unit 100. The A/D converter 300 is a circuit that converts an analog electric signal into a digital electric signal.

The antenna 11 receives wireless signals in a radio frequency bands (i.e., five frequency bands in this example) centered on the radio frequency RF. The wireless signal is transmitted by a wireless terminal not shown. The antenna 11 outputs the received wireless signal to the LNA 102.

The LNA 102 is a circuit that amplifies the wireless signal supplied from the antenna 11 while suppressing generation of a noise, and outputs the amplified wireless signal as a differential signal. As shown in FIG. 1, the LNA 102 includes a first LNA 1021 for amplifying the wireless signals in each frequency band with a predetermined gain, a balun 1022 for converting the wireless signals output from the first LNA 1021 in a format that can be processed by the reception unit 100, and a second LNA 1023 for amplifying the wireless signals converted by the balun 1022 with a predetermined gain. The balun 1022 is a conversion element that converts a single-phase signal into a differential signal. The single-phase wireless signal received by the antenna 101 is converted into a differential signal by the balun 1022. In the reception unit 100, by arranging the LNA 102 in the first stage, it is possible to increase the signal-to-noise ratio (S/N ratio) of the whole reception device 100 and to receive a weak radio wave.

The local oscillation unit 103 is an oscillation circuit that generates a differential signal having the same frequency as the carrier wave of wireless communication. As shown in FIG. 1, the local oscillator 103 includes a local oscillator 1031 and a multiplier 1032. The local oscillator 103 is an oscillation circuit that generates the above-mentioned differential signal, and is constituted by a frequency synthesizer using PLL (i.e., Phase Locked Loop), for example. The multiplier 1032 is, for example, a multiplier with a multiplication number of k equal to 2, multiplies the frequency by k (for example, double) by inputting the local oscillation signal having the frequency f, generates the high frequency signal having the frequency of k multiplied by f (for example, 2×f), and outputs the high frequency signal as an output signal.

The LOA 104 is a circuit that amplifies the differential signal output from the local oscillation unit 103, and outputs two differential signals having a phase difference. As shown in FIG. 1, the LOA 104 includes an amplifier circuit 1041 for amplifying the differential signal outputted from the local oscillator 103, a distributer 1042 for outputting the differential signal amplified by the amplifier circuit 1041 as two differential signals (for example, a differential signal having the I component and a differential signal having the Q component) having the phase difference, and amplifier circuits 1043a and 1043b that amplify respective differential signals having the phase difference. Here, the BGR 1044 is a circuit that generates a stable constant voltage value with respect to fluctuations in temperature and power supply voltage, using the band gap voltage.

The amplifier circuit 1041 is constituted by, for example, a circuit similar to the LNAs 1021 and 1023, amplifies the differential signal, and outputs the differential signal to the distributor 1042. The distributor 1042 is a distributor that divides the differential signal output from the amplifier circuit into two signals having, for example, a phase difference of 180°, and, for example, a polyphase filter or the like is used as the distributer 1042.

Amplifier circuits 1043a and 1043b are constituted by, for example, circuits similar to the LNAs 1021 and 1023, amplify the respective differential signals having the phase difference output from the distributor 1042, and output the amplified differential signals to the mixer 108.

The BIAS 105 is a circuit that supplies a bias voltage to the LNA 102, the LOA 104, the mixer 108, and the IFA 109.

The balun 106 is a conversion element that outputs the differential signal amplifier and output from the LNA 102 as two differential signals having a phase difference (for example, a differential signal having the I component and a differential signal having the Q component). The balun 106 outputs, for example, two differential signals having a phase difference of 180° to the mixer 108.

The monitor circuit 107 (as a first circuit) is a circuit that monitors resistance division voltage of resistors having different temperature characteristics. A specific configuration of the monitor circuit 107 will be described later.

The mixer 108 (as a second circuit) is a circuit that extracts a signal component having an intermediate frequency superimposed on a carrier wave, and outputs the signal component as a differential signal. The mixer 108 includes a first mixer 1081 and a second mixer 1082 that multiply the respective differential signals having a phase difference output from the balun 106 and the respective differential signal having a phase difference output from the LOA 104, and down-converts them. The specific configuration of the mixer 108 will be described later together with the monitor circuit 107.

The IFA 109 is a circuit that amplifies the differential signal having a signal component with the intermediate frequency generated by the mixer 108 to be an appropriate signal level. The IFA 109 includes a first IFA 1091 and a second IFA 1092 that output differential signals having a signal component with an intermediate frequency having a phase difference output from the mixer 108, and the IFA 109 outputs each differential signal to the BBF 200 arranged on an outside the reception unit 100.

The IC chip 110 (as a third circuit) is, for example, an arithmetic circuit including a CPU, a ROM, a main memory, and the like. The IC chip 110 calculates the ratio of the resistance division voltages which are the outputs of each resistor measured by the monitor circuit 107, and determines whether the calculated ratio of the resistance division voltage is equal to or larger than a predetermined threshold. When determining that the calculated ratio of the resistance division voltage is equal to or greater than a predetermined threshold, the IC chip 110 outputs a switching signal for switching the gain of the mixer 108 to the mixer 108. Since the IC chip 110 is disposed in the same reception unit 100 as the monitor circuit 107 and the mixer 108, the IC chip 110 is not susceptible to the influence of the noise on the measurement value received from the monitor circuit 107. Subsequently, specific configurations of the monitor circuit 107 and the mixer 108 will be described.

Figure 2:
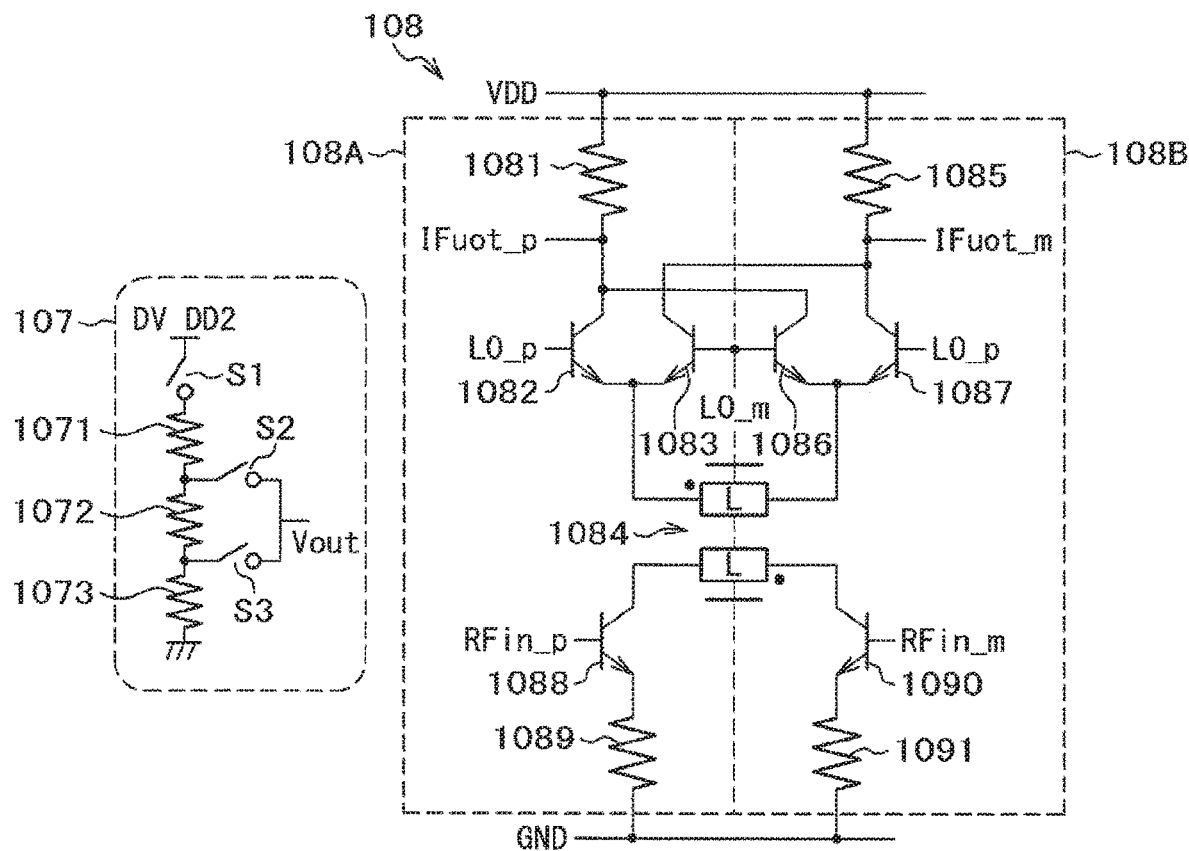
FIG. 2 is a diagram showing a specific configuration example of a monitor circuit and a mixer.

FIG. 2 is a diagram showing a specific configuration example of a monitor circuit 107 and a mixer 108. As shown in FIG. 2, the monitor circuit 107 is constituted by a resistance division voltage circuit having a resistor 1071, a resistor 1072, and a resistor 1073. The resistor 1071 and the resistor 1072 (as a first resistor) are resistors having temperature characteristics, and for example, are salicide resistors. Further, the resistor 1073 (as a second resistor) is a resistor having no temperature characteristic, and for example, is a polysilicon resistor.

Figure 3:
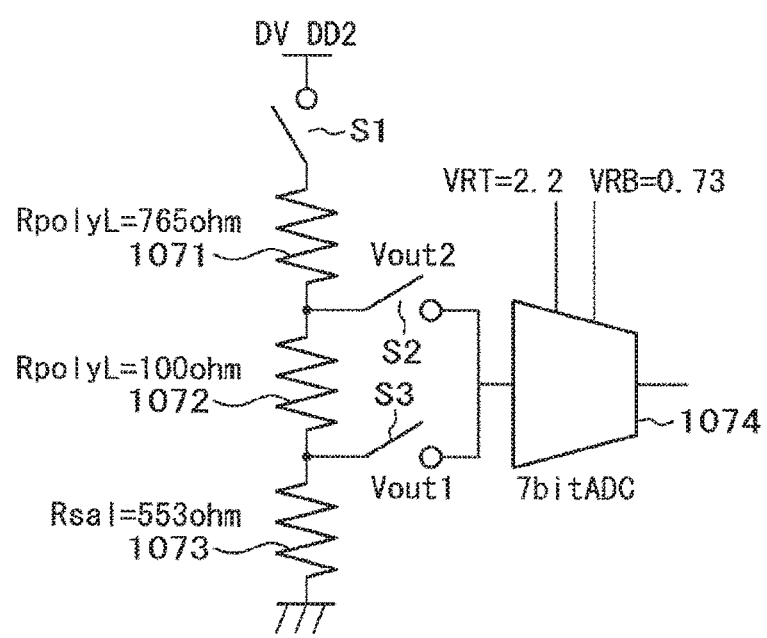
FIG. 3 is a diagram showing a more specific configuration example of a monitor circuit.

The resistor 1071 is connected to the power supply voltage DVDD2 via the switch S1. The switch S2 is a switch for measuring the voltage applied to the resistor 1072, and the switch S3 is a switch for measuring the voltage applied to the resistor 1072. By switching the switches S2 and S3, the voltage value VOUT by the resistor 1072 or the resistor 1073 can be measured. In practice, as shown in FIG. 3, the voltage value VOUT is converted into a digital value by the AD converter 1074, and is input to the IC chip 110. In the example shown in FIG. 3, a salicide resistor having 1,000 ohms is used for the resistor 1072, a polysilicon resistor having 553 ohms is used as the resistor 1073, these resistance division voltages are input to an A/D converter (having 7 bits) to be digitized, and the digitized voltages are input to the IC chip 110 via SPI (Serial Peripheral Interface). The A/D converter is disposed between VRB=0.73 V and VRT=2.2 V.

In this example, the monitor circuit 107 outputs the resistance division voltage, and the IC chip 110 calculates the ratio. Alternatively, the monitor circuit 107 may calculate the ratio, and output the result to the IC chip 110. In this case, since it is unnecessary to calculate the ratio of the resistance division voltages, the load of the IC chip 110 is reduced.

Subsequently, returning to FIG. 2, a configuration example of the mixer 108 will be described. As shown in FIG. 2, the mixer 108 has a first mixer 108A and a second mixer 108B. FIG. 2 shows a configuration example in the case where the mixer 108 has a phase difference of 180° (i.e., between p and m) between two input differential signals (i.e., LO).

The first mixer 108A includes a resistor 1081, a transistor 1082, a transistor 11083, a transistor 1088, and a resistor 1089. The second mixer 108B includes a resistor 1085, a transistor 1086, a transistor 1087, a transistor 1090, and a resistor 1091. The first mixer 108A and the second mixer 108B have the same configuration, and the resistor 1081 corresponds to the resistor 1085, the transistor 1082 corresponds to the transistor 1086, the transistor 1083 corresponds to the transistor 1087, the transistor 1088 corresponds to the transistor 1090, and the resistor 1089 corresponds to the resistor 1091, respectively.

The collector terminals of the transistors 1082 and 1086 are connected to each other, and the emitter terminals of the transistors 1082 and 1083 are connected to each other. In addition, the base terminals of the transistors 1082 and 1087 are input terminals of the differential signal (i.e., LO), and signals having the same phase are inputted into the base terminals. In FIG. 2, a signal having the same phase is input to the input terminal LO_p of the differential signal (i.e., LO).

Similarly, the collector terminals of the transistors 1083 and 1087 are connected to each other, and the emitter terminals of the transistors 1086 and 1087 are connected to each other. In addition, the base terminals of the transistors 1083 and 1086 are input terminals of the differential signal (i.e., LO), and signals having the same phase are inputted into the base terminals. In FIG. 2, a signal having the same phase is input to the input terminal LO_m of the differential signal (i.e., LO). The differential signal input to the input terminal LO_m has a phase opposite to the differential signal input to the input terminal LO_p.

A connection point between the transistor 1082 and the transistor 1083 and a connection point between the transistor 1086 and the transistor 1087 are connected to the transformer 1084. Transformer 1084 provides an inverse-sign transform coupling, and the current flowing through one lead pin decreases the current of the other lead pin, thereby reducing the gain deterioration.

In addition, the collector terminals of the transistor 1088 and the transistor 1090 are connected to the transformer 1084. The base terminal of the transistor 1088 is an input terminal for a differential signal (i.e., RF), which is RFin_p in FIG. 2. The emitter terminal of the transistor 1088 is connected to the resistor 1089, and the emitter terminal of the transistor 1090 is connected to the resistor 1091. The base terminal of the transistor 1088 is an input terminal for a differential signal (i.e., RF), which is RFin_p in FIG. 2. Further, the base terminal of the transistor 1090 is an input terminal of a differential signal (i.e., RF), which is RFin_m in FIG. 2.

The differential signal input to the input terminal RFin_m has a phase opposite to the differential signal input to the input terminal RFin_p.

Differential signals (i.e., RF) having opposite phases are input to the base terminal of the transistor 1088 and the base terminal of the transistor 1090. Since the opposite phase differential signal (RF) is input, the transistor 1088 and the transistor 1090 operate in opposite phases, a virtual short circuit is formed at the point where the emitter terminals of both transistors are connected, and the emitter terminals of the transistor 1088 and the transistor 1090 are grounded with respect to the high frequency.

One end of the resistor 1081 and the output terminal IFout_p of the differential signal (IF) are connected to a connection point between the transistor 1082 and the transistor 1086. One end of the resistor 1085 and the output terminal IFout_m of the differential signal (IF) are connected to a connection point between the transistor 1083 and the transistor 1087. The differential signal output from the output terminal IFout_m is a signal opposite in phase to the differential signal output from the output terminal IFout_p. The other end of the resistor 1081 is connected to the other end of the resistor 1085, and a power supply VDD is connected to the connection point between the other ends. The power supply supplies a direct current voltage to the collector terminal of the transistor 1082, the collector terminal of the transistor 1083, the collector terminal of the transistor 1086, and the collector terminal of the transistor 1087.

In the configuration of the present mixer 108, the differential signals (IF) output from the output terminal IFout_m and the output terminal IFout_p have an anti-phase relationship, so that a virtual short circuit is formed at the connection point between the resistor 1081 and the resistor 1085, and the present mixer 108 operates without being influenced by the power supply impedance. Note that a bipolar transistor may be used as a transistor, alternatively, a field effect transistor or another transistor may be used. When a field effect transistor is used, the base terminal which is the control terminal of the bipolar transistor corresponds to the gate terminal which is the control terminal of the field effect transistor, the collector terminal corresponds to the drain terminal, and the emitter terminal corresponds to the source terminal.

Further, in the present mixer 108, the differential signal (RF) side and the differential signal (LO) side are connected and coupled by the transformer 1084 which is transformer-coupled with the inductor element, and the impedance is matched so that the differential signal (IF) is outputted. Therefore, the linearity of the differential signal (IF) to be output is improved, and the power consumption of the mixer 108 is reduced. Further, it is possible to improve the temperature characteristics of the gain and the system NF, and as a result of stabilizing the gain, it is possible to prevent malfunction of the operation of the reception unit 100.

Further, in the mixer 108 of the present embodiment, the resistors 1081 and 1085 (as first resistors) and the resistors 1089 and 1091 (as second resistors), which constitute a pair for determining the gain, have different temperature characteristics. In this example, a salicide resistor having a temperature characteristic is used as the first resistor, and a polysilicon resistor having no temperature characteristic is used as the second resistor. When the gain of the reception unit decreases under a high temperature environment where the NF is low, the SN ratio deteriorates remarkably due to the quantization noise in the A/D converter 300 in the subsequent stage. Therefore, by providing the resistance of the mixer 108 with a salicide resistance, the gain of the reception unit is kept constant even when the temperature changes.

Further, the present mixer 108 is provided with a monitor circuit 107, and outputs the ratio of the resistance division voltage of the resistors 1072 and 1073 constituting the monitor circuit 107 or the value of each resistance division voltage to the IC chip 110. The IC chip 110 determines whether the ratio of the resistance division voltages calculated from the value of the respective resistance division voltages is changed by a certain threshold value or more, and when it is determined that the ratio of the resistance division voltages calculated from the value of the respective resistance division voltages or the ratio between the resistance division voltages is changed by a certain threshold value or more, the IC chip 110 determines that a temperature change equal to or more than a predetermined value occurs in the reception unit 100, and outputs a switching signal for switching the gain of the mixer 108 to the mixer 108.

Figure 4:
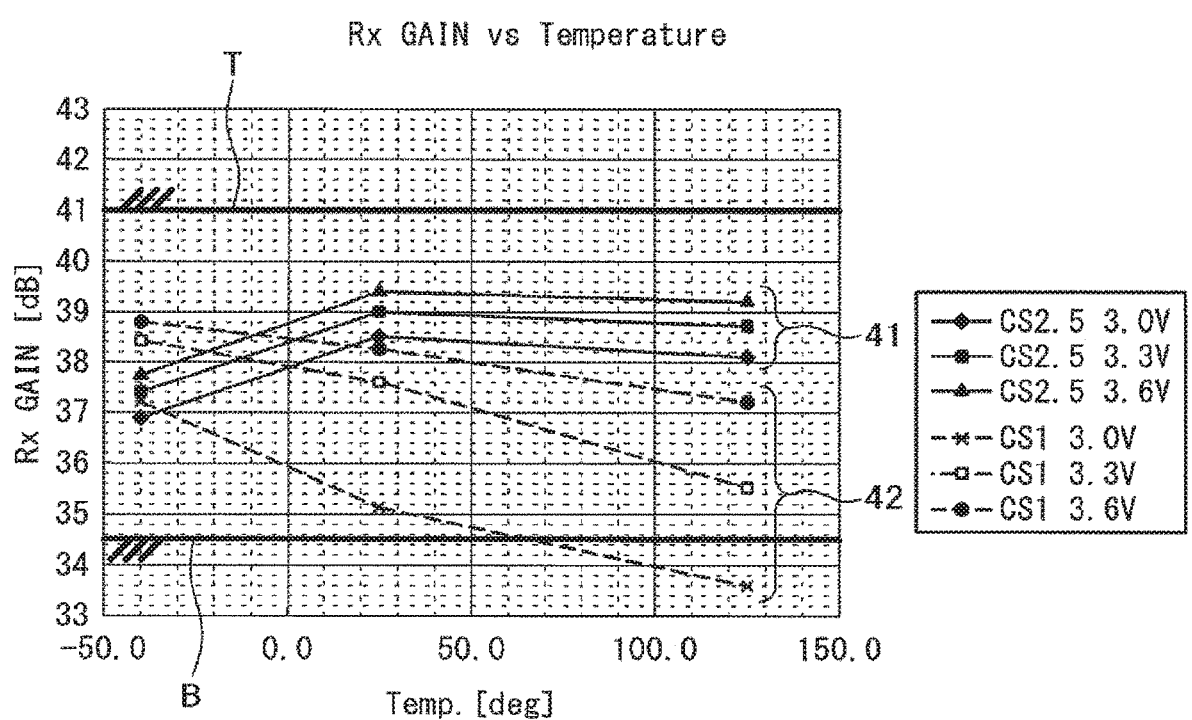
FIG. 4 is a diagram showing a comparison between a gain change when a resistor having a temperature dependence is used as the first resistor and a resistor having no temperature dependence is used as the second resistor, and a gain change when resistors having a temperature dependence are used as the first resistor and the second resistor.

FIG. 4 is a diagram showing a comparison between a gain change 41 when a resistor having a temperature dependence is used as the first resistor and a resistor having no temperature dependence is used as the second resistor and a gain change 42 when resistors having a temperature dependence are used as the first resistor and the second resistor. In FIG. 4, the vertical axis represents a gain (dB) and the horizontal axis represents temperature (deg). As shown in FIG. 4, when both the first resistor and the second resistor have temperature characteristics, the gain decreases as the temperature rises, and the gain falls below the admissible lower limit value B of the gain. On the other hand, when the first resistance has the temperature characteristic and the second resistance does not have the temperature characteristic, the gain increases up to a certain temperature, and thereafter, due to the switching signal, the gain is substantially constant in a range between the admissible lower limit value B and the upper limit value T.

In this example, a resistance element having a positive temperature characteristic in which the resistance value increases as the temperature rises, and a resistance element having no temperature characteristic are used as resistance elements having mutually different temperature characteristics, and the ratio of these resistance division voltages is calculated. Alternatively, the ratio of these resistance division voltages may be calculated using a resistance element having a negative temperature characteristic in which the resistance value decreases as the temperature becomes higher and a resistance element having no temperature characteristic. Alternatively, the ratio of these resistance division voltages may be calculated using a resistance element having a positive temperature characteristic in which the resistance value increases as the temperature rises and a resistance element having a negative temperature characteristic in which the resistance value decreases as the temperature becomes higher.

As described above, in the present embodiment, the pair of resistance elements for determining the gain in the mixer are resistors that are a combination of the first resistance and the second resistance having different temperature characteristics, and it is designed that the gain changes when the temperature changes. The element for determining the gain is disposed in the monitoring circuit for monitoring the resistance division voltage ratio between the first resistor and the second resistor, not for monitoring the operating current of the transistor, and the temperature characteristic of the resistance division voltage ratio is controlled to have the inverse characteristics of the temperature characteristics of the transistor. With such a configuration, it is possible to cancel the temperature dependence of the gain of the entire system.

More specifically, the correction of the temperature dependency is not performed by a current consumption of the circuit, but performed by a correction function in a circuit block determined by the resistance division voltage ratio, and a configuration is provided such that the consumption current of the block contributing to the RF characteristic does not have a temperature dependence. Therefore, without sacrificing the RF characteristics, it is possible to cancel the temperature dependence of the RF characteristic represented by the gain of the entire block. With providing a system for correcting the influence of manufacturing variations caused by combining different elements in general, it is possible to keep constant the temperature dependence of the circuit gain without measuring the environment dependency of the RF circuit, and it is possible to realize a highly accurate and inexpensive wireless circuit.

Normally, in a pair of elements having the same temperature characteristic, the difference in resistance value can be suppressed to several percents or less by designing the layout arrangement appropriately. However, when combining the first resistor and the second resistor as in this embodiment, since they are mutually different elements, for example, the resistance value of the first resistor may be manufactured to be higher by +15% than the original value and the resistance value of the second resistor may be manufactured to be lower by −15% than the original value. In this case, there is a possibility that an error of up to 30% may occur from the originally generated gain center value.

As described above, in order to improve the error with respect to the gain center value of the resistance value caused by configuring the circuit with different elements having manufacturing variations, the following functions are provided. That is, a circuit for monitoring the pair ratio (i.e., the resistance division ratio of the resistance of the first resistor and the resistance of the second resistor in this example) of resistance elements having different temperature characteristics is arranged in the vicinity of the circuit, and the circuit has a function of switching the gain, so that the gain caused by the initial manufacturing variations of the first resistor and the second resistor is corrected. In other words, when the temperature varies, the gain varies with the pair ratio of the resistance elements, so that the difference in gain between high temperature and low temperature is reduced, the temperature characteristic of the transistor is cancelled, and the constant gain with the temperature characteristic is realized. Moreover, by providing the consumption current not having a temperature characteristic, it becomes possible to maintain the noise characteristic and the distortion characteristic of the transistor, and it becomes possible to realize the desired RF characteristic in a wide range. Regarding the initial manufacturing variations, it is possible to realize the target gain by calculating the ratio of resistance division voltages from the result obtained by the monitor circuit.

It is also be said that the following objects are solved, for example. That is, in general, when the temperature becomes high, the transistor characteristics deteriorate, so the gain lowers and the system performance declines (i.e., the NF minimum reception sensitivity is reduced). In response to such an object, for example, by using resistors having a temperature characteristic as both resistors of the first resistor and the second resistor, the temperature is compensated using a circuit on the high temperature side, and the gain is kept constant. However, at low temperatures, the operation of the circuit may become unstable due to extreme current reduction, or the characteristics may deteriorate, so that gain may not be secured over a wide range from low temperature to high temperature merely by temperature compensation.

In addition, in the manufacture of semiconductors, in addition to correcting manufacturing variations, it is necessary to keep the gain constant even when a temperature change occurs during operation. When the gain is switched stepwise during operation, there may be a possibility that the radar which detects the object by signal processing of the continuous change in a signal may lead to a malfunction such as false detection. Therefore, a circuit system for analogically correcting amplification characteristics of transistors on a circuit is required. Usually, in order to compensate for the temperature dependence, measures are executed such that the reference current has a reverse temperature characteristic. In a wide temperature range, side effects may be generated such that electro-migration and heat generation occur due to an increase in current consumption caused by an excessive current at the upper temperature limit, and side effects may be generated such that noise characteristics are deteriorated due to an excessive current at the lower temperature limit. Thus, it is difficult to realize the desired RF characteristics over a wide temperature range. With the structure shown in this embodiment, the above objects can be solved.

What is claimed is:

1. A wireless receiver comprising:
a first circuit that converts and outputs a frequency of an input signal and includes a first resistor having a first temperature characteristic and a second resistor having a second temperature characteristic different from the first resistor,
one of the first resistor and the second resistor being connected between a power source and an output terminal of the first circuit,
another of the first resistor and the second resistor being connected between a ground and an input terminal of the first circuit, and
the first circuit having a gain which changes according to temperature change;
a second circuit that includes a third resistor having a same temperature characteristic as the first resistor and a fourth resistor having a same temperature characteristic as the second resistor and provides a resistance division voltage circuit,
the second circuit outputting an output of the third resistor and an output of the fourth resistor, or a ratio between the output of the third resistor and the output of the fourth resistor; and
a third circuit that switches the gain of the first circuit so as to reduce a change of the gain when a ratio between the outputs calculated from the outputs or the ratio between the outputs outputted from the second circuit is changed by a predetermined threshold value or more.

2. The wireless receiver according to claim 1, wherein:
the first resistor and the third resistor are configured to have a positive or negative temperature characteristic; and
the second resistor and the fourth resistor are configured to have no temperature characteristic.

3. The wireless receiver according to claim 1, wherein:
the first resistor and the third resistor are configured to have a positive or negative temperature characteristic;
the second resistor and the fourth resistor are configured to have a negative or positive temperature characteristic; and
the temperature characteristic of the first resistor is opposite to the second resistor.

4. The wireless receiver according to claim 1, wherein:
the second circuit is configured by a mixer circuit or an intermediate frequency amplifier circuit.

5. The wireless receiver according to claim 1, wherein:
the third circuit is arranged in a reception block including the first circuit and the second circuit.

6. A wireless reception method for switching a gain of a first circuit that converts and outputs a frequency of an input signal and includes a first resistor having a first temperature characteristic and a second resistor having a second temperature characteristic different from the first resistor, one of the first resistor and the second resistor being connected between a power source and an output terminal of the first circuit, another of the first resistor and the second resistor being connected between a ground and an input terminal of the first circuit, and the first circuit having a pain which changes according to temperature change, the wireless reception method comprising:
outputting, from a resistance division voltage circuit, an output of a third resistor having a same temperature characteristic as the first resistor and an output of a fourth resistor having a same temperature characteristic as the second resistor or a ratio between the output of the third resistor and the output of the fourth resistor, the resistance division voltage circuit including the third resistor and the fourth resistor; and
switching the gain of the first circuit, so as to reduce a change of the gain when a ratio between the outputs calculated from the outputs or the ratio between the outputs outputted from the second circuit is changed by a predetermined threshold value or more.

7. The wireless reception method according to claim 6, further comprising:

providing the first resistor and the third resistor configured to have a positive or negative temperature characteristic; and providing the second resistor and the fourth resistor configured to have no temperature characteristic.

8. The wireless reception method according to claim 6, further comprising:

providing the first resistor and the third resistor configured to have a positive or negative temperature characteristic;

providing the second resistor and the fourth resistor configured to have a negative or positive temperature characteristic; and wherein the temperature characteristic of the first resistor is opposite to the second resistor.

9. The wireless reception method according to claim 6, further comprising:

providing the second circuit configured by a mixer circuit or an intermediate frequency amplifier circuit.

10. The wireless reception method according to claim 6, further comprising:

providing the third circuit arranged in a reception block including the first circuit and the second circuit.

* * * * *